(12) United States Patent
Sheats et al.

(10) Patent No.: US 7,732,232 B2
(45) Date of Patent: Jun. 8, 2010

(54) SERIES INTERCONNECTED OPTOELECTRONIC DEVICE MODULE ASSEMBLY

(75) Inventors: James R. Sheats, Palo Alto, CA (US); Sam Kao, San Mateo, CA (US); Gregory A. Miller, Mountain View, CA (US); Martin R. Roscheisen, San Francisco, CA (US)

(73) Assignee: Nanosolar, Inc., San Jose, CA (US)

( * ) Notice: Subject to any disclaimer, the term of this patent is extended or adjusted under 35 U.S.C. 154(b) by 191 days.

(21) Appl. No.: 11/865,691

(22) Filed: Oct. 1, 2007

(65) Prior Publication Data

US 2008/0020503 A1 Jan. 24, 2008

Related U.S. Application Data

(63) Continuation of application No. 11/039,053, filed on Jan. 20, 2005, now Pat. No. 7,276,724.

(51) Int. Cl.
*H01L 21/00* (2006.01)
(52) U.S. Cl. ............................. 438/24; 438/25; 438/34; 438/39
(58) Field of Classification Search ................... 438/24, 438/25, 26, 28, 34, 39
See application file for complete search history.

(56) References Cited

U.S. PATENT DOCUMENTS

| | | | |
|---|---|---|---|
| 3,818,324 A * | 6/1974 | Espinasse | 324/374 |
| 3,903,427 A | 9/1975 | Pack | |
| 3,903,428 A | 9/1975 | DeJong | |
| 4,227,942 A | 10/1980 | Hall | |

(Continued)

FOREIGN PATENT DOCUMENTS

CN 1036298 A 10/1998

(Continued)

OTHER PUBLICATIONS

U.S. Appl. No. 11/427,328 filed on Jun. 28, 2006 which is Pending claims the benefit of 11/207,157.

(Continued)

*Primary Examiner*—Walter L Lindsay, Jr.

(57) ABSTRACT

Series interconnection of optoelectronic device modules is disclosed. Each device module includes an active layer disposed between a bottom electrode and a transparent conducting layer. An insulating layer is disposed between the bottom electrode of a first device module and a backside top electrode of the first device module. One or more vias are formed through the active layer, transparent conducting layer and insulating layer of the first device module. Sidewalls of the vias are coated with an insulating material such that a channel is formed through the insulating material to the backside top electrode of the first device module. The channel is at least partially filled with an electrically conductive material to form a plug that makes electrical contact between the transparent conducting layer and the backside top electrode of the first device module. Portions of the backside top electrode and insulating layer of a second device module are cut back to expose a portion of the bottom electrode of the second device module. The first and second device modules are attached to an insulating carrier substrate. Electrical contact is made between the backside top electrode of the first device module and the exposed portion of the bottom electrode of the second device module.

14 Claims, 5 Drawing Sheets

U.S. PATENT DOCUMENTS

| | | | |
|---|---|---|---|
| 4,499,658 A | 2/1985 | Lewis | |
| 4,574,160 A | 3/1986 | Cull | |
| 4,755,475 A | 7/1988 | Kiyama et al. | |
| 4,786,607 A | 11/1988 | Yamazaki et al. | |
| 4,849,029 A | 7/1989 | Delahoy | |
| 4,860,509 A | 8/1989 | Laaly et al. | |
| 4,865,999 A | 9/1989 | Xi et al. | |
| 4,872,925 A | 10/1989 | McMaster | |
| 4,981,525 A | 1/1991 | Kiyama et al. | |
| 5,139,959 A * | 8/1992 | Craft et al. | 438/328 |
| 5,254,179 A | 10/1993 | Ricaud et al. | |
| 5,268,037 A | 12/1993 | Glatfelter | |
| 5,421,908 A | 6/1995 | Yoshida et al. | |
| 5,468,652 A | 11/1995 | Gee | |
| 5,501,744 A | 3/1996 | Albright | |
| 5,587,264 A * | 12/1996 | Iijima et al. | 430/57.1 |
| 5,626,686 A | 5/1997 | Yoshida | |
| 5,733,381 A | 3/1998 | Ota et al. | |
| 5,928,439 A | 7/1999 | Ota et al. | |
| 6,034,810 A * | 3/2000 | Robinson et al. | 359/293 |
| 6,083,801 A * | 7/2000 | Ohtani | 438/308 |
| 6,265,652 B1 | 7/2001 | Kurata et al. | |
| 6,268,014 B1 | 7/2001 | Eberspacher et al. | |
| 6,437,231 B2 | 8/2002 | Kurata et al. | |
| 6,455,347 B1 | 9/2002 | Hiraishi et al. | |
| 6,573,445 B1 | 6/2003 | Burgers | |
| 6,750,662 B1 | 6/2004 | Van Der Heide | |
| 6,787,405 B2 | 9/2004 | Chen | |
| 6,846,696 B2 | 1/2005 | Adachi et al. | |
| 7,122,398 B1 | 10/2006 | Pichler | |
| 7,144,751 B2 | 12/2006 | Gee et al. | |
| 7,170,001 B2 | 1/2007 | Gee et al. | |
| 7,276,724 B2 | 10/2007 | Sheats et al. | |
| 2003/0103181 A1 | 6/2003 | Imayama et al. | |
| 2003/0227021 A1 | 12/2003 | Yamazaki et al. | |
| 2004/0144419 A1 | 7/2004 | Fix | |
| 2004/0219730 A1 | 11/2004 | Basol | |
| 2004/0261839 A1 | 12/2004 | Gee et al. | |
| 2004/0261840 A1 | 12/2004 | Schmit et al. | |
| 2005/0172996 A1 | 8/2005 | Hacke et al. | |
| 2005/0172998 A1 | 8/2005 | Gee et al. | |
| 2005/0176164 A1 | 8/2005 | Gee et al. | |
| 2005/0217719 A1 | 10/2005 | Mahieu et al. | |
| 2006/0107471 A1 | 5/2006 | Spath et al. | |
| 2006/0118165 A1 | 6/2006 | Van Roosmalen et al. | |
| 2006/0121748 A1 | 6/2006 | Brieko | |
| 2006/0160261 A1 | 7/2006 | Sheats et al. | |

FOREIGN PATENT DOCUMENTS

| | | |
|---|---|---|
| WO | WO2006/078985 A3 | 7/2006 |
| WO | WO2007/022221 A3 | 2/2007 |

OTHER PUBLICATIONS

U.S. Appl. No. 11/933,416 filed on Oct. 31, 2007 which is Pending claims the benefit of 11/207,157.
U.S. Appl. No. 11/762,040 filed on Jun. 12, 2007 which is Pending claims the benefit of 11/207,157.
U.S. Appl. No. 11/762,043 filed on Jun. 12, 2007 which is Pending claims the benefit of 11/207,157.
U.S. Appl. No. 11/762,048 filed on Jun. 12, 2007 which is Pending claims the benefit of 11/207,157.
U.S. Appl. No. 11/278,648 filed on Apr. 04, 2006 which is Pending claims the benefit of 11/207,157.
U.S. Appl. No. 11/278,645 filed on Apr. 04, 2006 which is Pending claims the benefit of 11/207,157.
U.S. Appl. No. 12/064,031 filed on Feb. 16, 2008 which is Pending claims the benefit of 11/207,157.
Office Action from Chinese patent application Ser. No. 200680006141.8.
Office Action from U.S. Appl. No. 11/039,053.
Office Action from U.S. Appl. No. 11/207,157.
J. Jay Wimer in "3-D Chip Scale with Lead-Free Processes" in Semiconductor International, Oct. 1, 2003.
"Global Soalr Process" slides 9,.10, 11,23,24 presented at 29th IEEE PVSC, Polycrystalline Thin-Film Solar Cells — Manufacturing Technology, Part 2, May 18-25, 2002, New Orleans, La.
A. Duggal et al., "OLEDs for Lighting: new Approaches" in Organic Light-Emitting Materials and Devices VII edited by Sakya H. Katafi, Paul A. Lane, Proceedings of SPIE vol. 5214 pp. 241-247 (SPIE, Bellingham, WA, Feb. 2004).
Miasole Solution from http://www.miasole.com/solution/asp 2003.
Pearnchob et al. "Coating of pellets with micronized ethylcellulose particles by dry powder coating technique" International Journal of Pharmaceutics 268 (2003) 1-11).
US Office Action from U.S. Appl. No. 11/278,648 dated Mar. 4, 2009.
US Office Action from U.S. Appl. No. 11/278,648 dated Dec. 23, 2009.
US Office Action from U.S. Appl. No. 11/278,645 dated Dec. 30, 2008.
US Office Action from U.S. Appl. No. 11/278,645 dated Aug. 3, 2009.
US Office Action from U.S. Appl. No. 11/245,734 dated Sep. 28, 2009.
US Office Action from U.S. Appl. No. 11/933,416 dated Sep. 14, 2009.
US Office Action from U.S. Appl. No. 11/207,157 dated Jul. 29, 2008.
US Office Action from U.S. Appl. No. 11/207,157 dated May 13, 2009.
US Office Action from U.S. Appl. No. 11/427,328 dated May 20, 2009.
US Office Action from U.S. Appl. No. 11/039,053 dated Jan. 5, 2007.

* cited by examiner

SERIES INTERCONNECTED OPTOELECTRONIC DEVICE MODULE ASSEMBLY

CROSS-REFERENCE TO RELATED APPLICATION

This application is a continuation of U.S. patent application Ser. No. 11/039,053 filed on Jan. 20, 2005 now U.S. Pat. No. 7,276,724, fully incorporated herein by reference for all purposes.

FIELD OF THE INVENTION

This invention relates to optoelectronic devices and more particularly to series interconnection of optoelectronic device modules.

BACKGROUND OF THE INVENTION

Optoelectronic devices generally include light-emitting devices and photovoltaic devices. These devices generally include an active layer sandwiched between two electrodes, sometimes referred to as the front and back electrodes, at least one of which is typically transparent. The active layer typically includes one or more semiconductor materials. In a light-emitting device, e.g., a light-emitting diode (LED), a voltage applied between the two electrodes causes a current to flow through the active layer. The current causes the active layer to emit light. In a photovoltaic device, e.g., a solar cell, the active layer absorbs energy from light and converts this energy to electrical energy exhibited as a voltage and/or current between the two electrodes. Both types of optoelectronic devices often use a layer of transparent conductive oxide (TCO), such as zinc oxide, in the transparent electrode. A common problem to both types of optoelectronic devices is the relatively high electrical resistivity of the TCO, which leads to resistive losses and consequent inefficiencies in the device.

To overcome this, optoelectronic devices have been developed with electrically isolated conductive contacts that pass through the cell from a transparent "front" electrode through the active layer and the "back" electrode to an electrically isolated electrode located beneath the back electrode. U.S. Pat. No. 3,903,427 describes an example of the use of such contacts in silicon-based solar cells. Although this technique does reduce resistive losses and can improve the overall efficiency of solar cell devices, the costs of silicon-based solar cells remains high due to the vacuum processing techniques used in fabricating the cells as well as the expense of thick, single-crystal silicon wafers. This has led solar cell researchers and manufacturers to develop different types of solar cells that can be fabricated less expensively and on a larger scale than conventional silicon-based solar cells. Examples of such solar cells include cells with active absorber layers comprised of silicon (e.g. for amorphous, micro-crystalline, or polycrystalline silicon cells), organic oligomers or polymers (for organic solar cells), bilayers or interpenetrating layers or inorganic and organic materials (for hybrid organic/inorganic solar cells), dye-sensitized titania nanoparticles in an liquid or gel-based electrolyte (for Graetzel cells), copper-indium-gallium-selenium (for CIG solar cells), cells whose active layer is comprised of CdSe, CdTe, and combinations of the above, where the active materials are present in any of several forms including but not limited to bulk materials, micro-particles, nano-particles, or quantum dots. Many of these types of cells can be fabricated on flexible substrates (e.g., stainless steel foil).

A further problem associated with existing solar fabrication techniques arises from the fact that individual optoelectronic devices produce only a relatively small voltage. Thus, it is often necessary to electrically connect several devices together in series in order to obtain higher voltages in order to take advantage of the efficiencies associated with high voltage, low current operation (e.g. power transmission through a circuit using relatively higher voltage, which reduces resistive losses that would otherwise occur during power transmission through a circuit using relatively higher current).

Several designs have been previously developed to interconnect solar cells into modules. For example, early photovoltaic module manufacturers attempted to use a "shingling" approach to interconnect solar cells, with the bottom of one cell placed on the top edge of the next, similar to the way shingles are laid on a roof. Unfortunately the solder and silicon wafer materials were not compatible. The differing rates of thermal expansion between silicon and solder and the rigidity of the wafers caused premature failure of the solder joints with temperature cycling.

A further problem associated with series interconnection of optoelectronic devices arises from the high electrical resistivity associated with the TCO used in the transparent electrode. The high resistivity restricts the size of the individual cells that are connected in series. Consequently, a large number of small cells must be connected together, which requires a large number of interconnects. Arrays of large numbers of small cells are relatively difficult and expensive to manufacture. Further, with flexible solar modules, shingling is also disadvantageous in that the interconnection of a large number of shingles is relatively complex, time-consuming and labor-intensive, and therefore costly during the module installation process.

Thus, there is a need in the art, for a technique for series connection of optoelectronic devices that overcomes the above disadvantages.

BRIEF DESCRIPTION OF THE DRAWINGS

The teachings of the present invention can be readily understood by considering the following detailed description in conjunction with the accompanying drawings, in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Figure 1A:
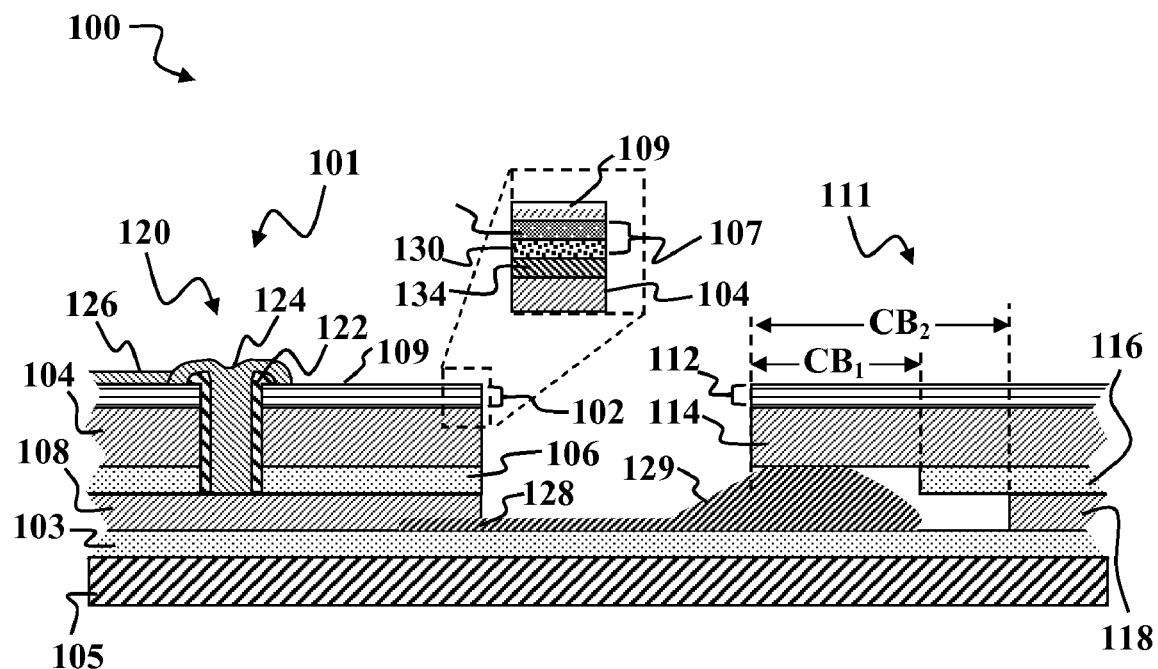
FIG. 1A is a vertical cross-sectional schematic diagram of a portion of an array of optoelectronic devices according to an embodiment of the present invention.
Figure 1B:
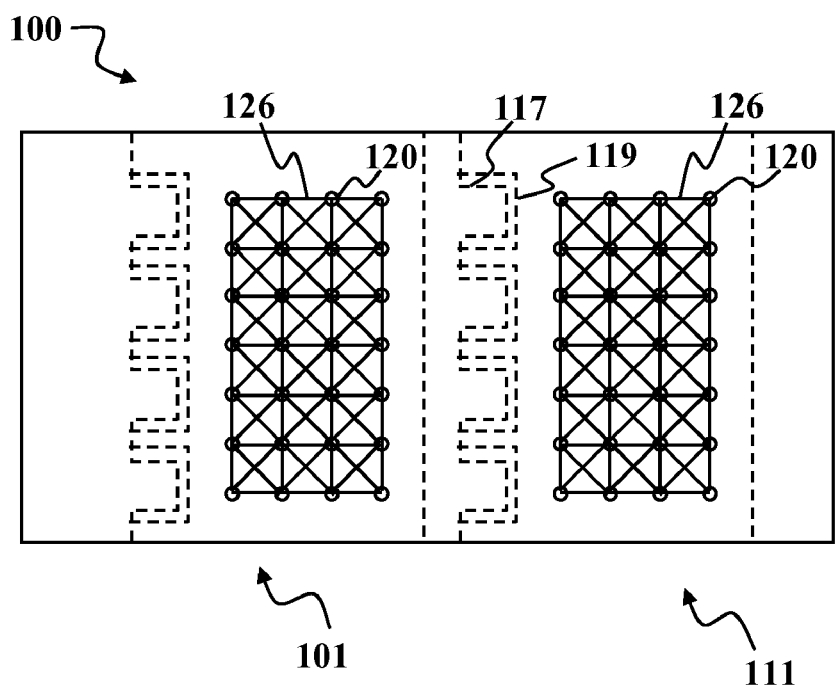
FIG. 1B is a plan view schematic diagram of the array of FIG. 1A.

FIGS. 1A-1B illustrates series interconnection in an array 100 of optoelectronic devices. The array 100 includes a first device module 101 and a second device module 111. The device modules 101, 111 may be photovoltaic devices, such as solar cells, or light-emitting devices, such as light-emitting diodes. In a preferred embodiment, the device modules 101, 111 are solar cells. The first and second device modules 101, 111 are attached to an insulating carrier substrate 103, which may be made of a plastic material such as polyethylene teraphtalate (PET), e.g., about 50 microns thick. The carrier substrate 103 may, in turn, be attached to a thicker structural membrane 105, e.g., made of a polymeric roofing membrane material such as thermoplastic polyolefin (TPO) or ethylene propylene diene monomer (EPDM), to facilitate installing the array 100 on an outdoor location such as a roof.

The device modules 101, 111, which may be about 4 inches in length and 12 inches wide, may be cut from a much longer sheet containing several layers that are laminated together. Each device module 101, 111 generally includes a device layer 102, 112 in contact with a bottom electrode 104, 114 and an insulating layer 106, 116 between the bottom electrode 104, 114 and a backside top electrode 108, 118. By way of example, the device layers 102, 112 may be about 2 microns thick, the bottom electrodes 104, 114 may be made of aluminum foil about 100 microns thick; the insulating layers 106, 116 may be made of a plastic material, such as polyethylene teraphthalate (PET) about 25 microns thick; and the backside top electrodes 108, 118 may be made of aluminum foil about 25 microns thick. The device layers 102, 112 generally include an active layer 107 disposed between a transparent conductive layer 109 and the bottom electrode 104. At least the first device 101 includes one or more electrical contacts 120 between the transparent conducting layer 109 and the backside top electrode 108. The electrical contacts 120 are formed through the transparent conducting layer 109, the active layer 107, the bottom electrode 104 and the insulating layer 106. The electrical contacts 120 provide an electrically conductive path between the transparent conducting layer 109 and the backside tope electrode 108. The electrical contacts 120 are electrically isolated from the active layer 107, the bottom electrode 104 and the insulating layer 106.

The contacts 120 may each include a via formed through the active layer 107, the transparent conducting layer 109, the bottom electrode 104 and the insulating layer 106. Each via may be about 500 microns in diameter. The vias may be formed by punching or by drilling, for example by mechanical, laser or electron beam drilling, or by a combination of these techniques. An insulating material 122 coats sidewalls of the via such that a channel is formed through the insulating material 122 to the backside top electrode 108. The insulating material 122 should preferably be at least 10 microns thick to ensure complete coverage of the exposed conductive surfaces behind it. The insulating material 122 may be formed by a variety of printing techniques, including for example inkjet printing or dispensing through an annular nozzle. A plug 124 made of an electrically conductive material at least partially fills the channel and makes electrical contact between the transparent conducting layer 109 and the backside top electrode 108. The electrically conductive material may similarly be printed. A suitable material and method, for example, is inkjet printing of solder (called "solderjet" by Microfab, Inc., Plano, Tex., which sells equipment useful for this purpose). Printing of conductive adhesive materials known in the art for electronics packaging may also be used, provided time is allowed subsequently for solvent removal and curing.

The formation of good contacts between the conductive plug 124 and the substrate 108 may be assisted by the use of other interface-forming techniques such as ultrasonic welding. An example of a useful technique is the formation of gold stud-bumps, as described for example by J. Jay Wimer in "3-D Chip Scale with Lead-Free Processes" in Semiconductor International, Oct. 1, 2003, which is incorporated herein by reference. Ordinary solders or conductive inks or adhesives may be printed on top of the stud bump.

In forming the vias, it is important to avoid making shorting connections between the top electrode 109 and the bottom electrode 104. Therefore, mechanical cutting techniques such as drilling or punching may be advantageously supplemented by laser ablative removal of a small volume of material near the lip of the via, a few microns deep and a few microns wide.

A further method for avoiding shorts involves deposition of a thin layer of insulating material on top of the active layer 107 prior to deposition of the transparent conducting layer 109. This insulating layer is preferably several microns thick, and may be in the range of 1 to 100 microns. Since it is deposited only over the area where a via is to be formed (and slightly beyond the borders of the via), its presence does not interfere with the operation of the optoelectronic device. This layer is similar to structures described in U.S. patent application Ser. No. 10/810,072 to Karl Pichler, filed Mar. 25, 2004, which is hereby incorporated by reference. When a hole is drilled or punched through this structure, there is a layer of insulator between the transparent conducting layer 109 and the bottom electrode 104 which may be relatively thick compared to these layers and to the precision of mechanical cutting processes, so that no short can occur.

The material for this layer can be any convenient insulator, preferably one that can be digitally (e.g. inkjet) printed. Thermoplastic polymers such as Nylon PA6 (m.p. 223° C.), acetal (m.p. 165° C.), PBT (structurally similar to PET but with a butyl group replacing the ethyl group) (m.p. 217° C.), and polypropylene (m.p. 165° C.), are examples which by no means exhaust the list of useful materials. These materials may also be used for the insulating layer 122. While inkjet printing is a desirable way to form the insulator islands, other methods of printing or deposition (including conventional photolithography) are also within the scope of the invention.

In forming the vias, it is useful to fabricate the optoelectronic device in at least two initially separate elements, with one comprised of the insulating layer 106, the bottom electrode 104 and the layers 102 above it, and the second comprised of the backside top electrode 108. These two elements are then laminated together after the vias have been formed through the composite structure 106/104/102, but before the vias are filled. After this lamination and via formation, the backside top electrode 108 is laminated to the composite, and the vias are filled as described above.

Although jet-printed solders or conductive adhesives comprise useful materials for forming the conductive via plug 124, it is also possible to form this plug by mechanical means. Thus, for example, a wire of suitable diameter may be placed in the via, forced into contact with the backside top electrode 108, and cut off at the desired height to form the plug 124, in a manner analogous to the formation of gold stud bumps. Alternatively a pre-formed pin of this size can be placed into the hole by a robotic arm. Such pins or wires can be held in place, and their electrical connection to the substrate assisted or assured, by the printing of a very thin layer of conductive adhesive prior to placement of the pin. In this way the problem of long drying time for a thick plug of conductive adhesive is eliminated. The pin can have tips or serrations on it which punch slightly into the backside top electrode 108, further assisting contact.

Such pins may be provided with insulation already present, as in the case of insulated wire or coated wire (e.g. by vapor deposition or oxidation). They can be placed in the via before the application of the insulating material, making it easier to introduce this material.

If the pin is made of a suitably hard metal, and has a slightly tapered tip, it may be used to form the via during the punching step. Instead of using a punch or drill, the pin is inserted into the composite 106/104/102, to a depth such that the tip just penetrates the bottom; then when the substrate 108 is laminated to this composite, the tip penetrates slightly into it and forms a good contact. These pins may be injected into the unpunched substrate by, for example, mechanical pressure or air pressure directed through a tube into which the pin just fits.

One or more conductive traces 126, e.g., made of Al, Ni, or Ag, may be disposed on the transparent conducting layer 109 in electrical contact with the electrically conductive material 124. As shown in FIG. 1B, the traces 126 may interconnect multiple contacts 120 to reduce the overall sheet resistance. By way of example, the contacts 120 may be spaced about 1 centimeter apart from one another with the traces 126 connecting each contact with its nearest neighbors. Preferably, the number, width and spacing of the traces 126 is chosen such that the contacts 120 and traces 126 cover less than about 1% of the surface of the device module 101.

Electrical contact between the backside top electrode 108 of the first device module 102 and the bottom electrode 114 of the second device module 112 is implemented by cutting back the backside top electrode 118 and insulating layer 116 of the second device module to expose a portion of the bottom electrode 114. FIG. 1B illustrates an example of one way, among others, for cutting back the backside top electrode 118 and insulating layer 116. Specifically, notches 117 may be formed in an edge of the insulating layer 116. The notches 117 align with similar, but slightly larger notches 119 in the backside top electrode 118. The alignment of the notches 117, 119 exposes portions of the bottom electrode 114 of the second device module 111.

Electrical contact may be made between the backside top electrode 108 of the first device module 102 and the exposed portion of the bottom electrode 114 of the second device module 112 in a number of different ways. For example, as shown in FIG. 1A, thin conducting layer 128 may be disposed over a portion of the carrier substrate 103 in a pattern that aligns with the notches 117, 119.

The thin conducting layer may be, e.g., a conductive (filled) polymer or silver ink. The conducting layer can be extremely thin, e.g., about 1 micron thick. A general criteria for determining the minimum thickness of the thin conducting layer 128 is that the fractional power $p=(J/V)\rho(L_o^2/d)$ dissipated in this layer is about $10^{-5}$ or less, where J is the current density, V is the voltage, $L_o$ is the length of the thin conducting layer 128 (roughly the width of the gap between the first and second device modules) and $\rho$ and d are respectively the resistivity and the thickness of the thin conductive layer 128. By way of numerical example, for many applications (J/V) is roughly 0.06 A/Vcm$^2$. If $L_o$=400 microns=0.04 cm then p is approximately equal to $10^{-4}$ ($\rho$/d). Thus, even if the resistivity $\rho$ is about $10^{-5}$ $\Omega$cm (which is about ten times less than for a good bulk conductor), d can be about 1 micron ($10^{-4}$ cm) thick. Thus, even a relatively resistive polymer conductor of almost any plausible thickness will work.

The first device module 102 may be attached to the carrier substrate 103 such that the backside top electrode 108 makes electrical contact with the thin conducting layer 128 while leaving a portion of the thin conducting layer 128 exposed. Electrical contact may then be made between the exposed portion of the thin conducting layer 128 and the exposed portion of the bottom electrode 114 of the second device module 112. For example, a bump of conductive material 129 (e.g., more conductive adhesive) may be placed on the thin conducting layer 128 at a location aligned with the exposed portion of the bottom electrode 114. The bump of conductive material 129 is sufficiently tall as to make contact with the exposed portion of the bottom electrode 114 when the second device module 111 is attached to the carrier substrate. The dimensions of the notches 117, 119 may be chosen so that there is essentially no possibility that the thin conducting layer 128 will make undesired contact with the backside top electrode 118 of the second device module 111. For example, the edge of the bottom electrode 114 may be cut back with respect to the insulating layer 116 by an amount of cutback $CB_1$ of about 400 microns. The backside top electrode 118 may be cut back with respect to the insulating layer 116 by an amount $CB_2$ that is significantly larger than $CB_1$.

The device layers 102, 112 are preferably of a type that can be manufactured on a large scale, e.g., in a roll-to-roll processing system. There are a large number of different types of device architectures that may be used in the device layers 102, 112. By way of example, and without loss of generality, the inset in FIG. 1A shows the structure of a CIGS active layer 107 and associated layers in the device layer 102. By way of example, the active layer 107 may include an absorber layer 130 based on materials containing elements of groups IB, IIIA and VIA. Preferably, the absorber layer 130 includes copper (Cu) as the group IB, Gallium (Ga) and/or Indium (In) and/or Aluminum as group IIIA elements and Selenium (Se) and/or Sulfur (S) as group VIA elements. Examples of such materials (sometimes referred to as CIGS materials) are described in U.S. Pat. No. 6,268,014, issued to Eberspacher et al on Jul. 31, 2001, and International Application Publication WO 02/084708 to Basol, published Oct. 24, 2002, both of which are incorporated herein by reference. A window layer 132 is typically used as a junction partner between the absorber layer 130 and the transparent conducting layer 109. By way of example, the window layer 132 may include cadmium sulfide (CdS), zinc sulfide (ZnS), or zinc selenide (ZnSe) or some combination of two or more of these. Layers of these materials may be deposited, e.g., by chemical bath deposition or chemical surface deposition, to a thickness of about 50 nm to about 100 nm. A contact layer 134 of a metal different from the bottom electrode may be disposed between the bottom electrode 104 and the absorber layer 130 to inhibit diffusion of metal from the bottom electrode 104. For example, if the bottom electrode 104 is made of aluminum, the contact layer 134 may be a layer of molybdenum.

Although CIGS solar cells are described for the purposes of example, those of skill in the art will recognize that embodiments of the series interconnection technique can be applied to almost any type of solar cell architecture. Examples of such solar cells include, but are not limited to: cells based on amorphous silicon, Graetzel cell architecture (in which an optically transparent film comprised of titanium dioxide particles a few nanometers in size is coated with a monolayer of charge transfer dye to sensitize the film for light harvesting), a nanostructured layer having an inorganic porous semiconductor template with pores filled by an organic semiconductor material, a polymer/blend cell architecture, organic dyes, and/or $C_{60}$ molecules, and/or other small molecules, micro-crystalline silicon cell architecture, randomly placed nanorods and/or tetrapods of inorganic materials dispersed in an organic matrix, quantum dot-based cells, or combinations of the above. Furthermore, embodiments of the series interconnection technique described herein can be used with optoelectronic devices other than solar cells.

Alternatively, the optoelectronic devices 101, 111 may be light emitting devices, such as organic light emitting diodes (OLEDs). Examples of OLEDs include light-emitting polymer (LEP) based devices. In such a case, the active layer 107 may include a layer of poly (3,4) ethylendioxythiophene: polystyrene sulfonate (PEDOT:PSS), which may be deposited to a thickness of typically between 50 and 200 nm on the bottom electrodes 104, 114, e.g., by web coating or the like, and baked to remove water. PEDOT:PSS is available from Bayer Corporation of Leverkusen, Germany. A polyfluorene based LEP may then be deposited on the PEDOT:PSS layer (e.g., by web coating) to a thickness of about 60-70 nm. Suitable polyfluorene-based LEPs are available from Dow Chemicals Company.

The transparent conductive layer 109 may be, e.g., a transparent conductive oxide (TCO) such as zinc oxide (ZnO) or aluminum doped zinc oxide (ZnO:Al), which can be deposited using any of a variety of means including but not limited to sputtering, evaporation, CBD, electroplating, CVD, PVD, ALD, and the like. Alternatively, the transparent conductive layer 109 may include a transparent conductive polymeric layer, e.g. a transparent layer of doped PEDOT (Poly-3,4-Ethylenedioxythiophene), which can be deposited using spin, dip, or spray coating, and the like. PSS:PEDOT is a doped, conducting polymer based on a heterocyclic thiophene ring bridged by a diether. A water dispersion of PEDOT doped with poly(styrenesulfonate) (PSS) is available from H.C. Starck of Newton, Mass. under the trade name of Baytron® P. Baytron® is a registered trademark of Bayer Aktiengesellschaft (hereinafter Bayer) of Leverkusen, Germany. In addition to its conductive properties, PSS:PEDOT can be used as a planarizing layer, which can improve device performance. A potential disadvantage in the use of PEDOT is the acidic character of typical coatings, which may serve as a source through which the PEDOT may chemically attack, react with, or otherwise degrade the other materials in the solar cell. Removal of acidic components in PEDOT may be carried out by anion exchange procedures. Non-acidic PEDOT can be purchased commercially. Alternatively, similar materials can be purchased from TDA materials of Wheat Ridge, Colo., e.g. Oligotron™ and Aedotron™.

The gap between the first device module 101 and the second device module 111 may be filled with a curable polymer epoxy, e.g., silicone. An optional encapsulant layer (not shown) may cover the array 100 to provide environmental resistance, e.g., protection against exposure to water or air. The encapsulant may also absorb UV-light to protect the underlying layers.

Examples of suitable encapsulant materials include one or more layers of fluoropolymers such as THV (e.g. Dyneon's THV220 fluorinated terpolymer, a fluorothermoplastic polymer of tetrafluoroethylene, hexafluoropropylene and vinylidene fluoride), Tefzel® (DuPont), Tefdel, ethylene vinyl acetate (EVA), thermoplastics, polyimides, polyamides, nanolaminate composites of plastics and glasses (e.g. barrier films such as those described in commonly-assigned, co-pending U.S. patent application Ser. No. 10/698,988, to Brian Sager and Martin Roscheisen, filed Oct. 31, 2003, and entitled "INORGANIC/ORGANIC HYBRID NANOLAMINATE BARRIER FILM"), and combinations of the above.

Figure 2:
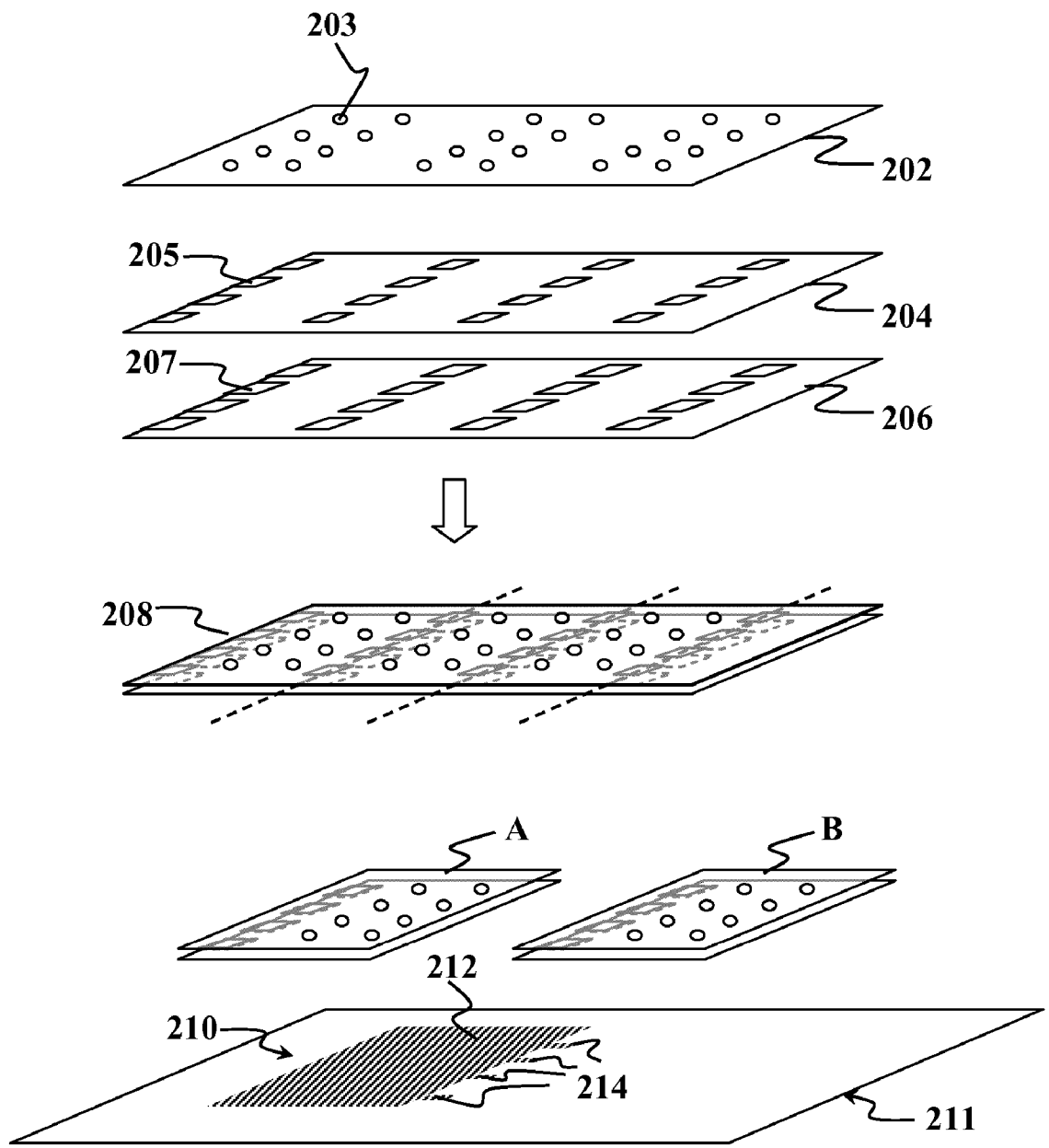
FIG. 2 is a sequence of schematic diagrams illustrating fabrication of an array of optoelectronic devices according to an embodiment of the present invention.

There are a number of different methods of fabricating interconnected devices according to embodiments of the present invention. For example, FIG. 2 illustrates one such method. In this method the devices are fabricated on a continuous device sheet 202 that includes an active layer between a bottom electrode and a backside top electrode, e.g., as described above with respect to FIGS. 1A-1B. The device sheet 202 is also patterned with contacts 203 like the contact 120 depicted in FIG. 1A. The contacts 203 may be electrically connected by conductive traces (not shown) as described above. An insulating layer 204 and a backside top electrode 206 are also fabricated as continuous sheets. In the example shown in FIG. 2, the insulating layer 204 has been cut back, e.g., to form notches 205 that align with similar notches 207 in the backside top electrode layer 206. The notches in the backside top electrode layer 206 are larger than the notches in the insulating layer 204. The device sheet 202, insulating layer 204 and backside top electrode layer are laminated together to form a laminate 208 having the insulating layer 204 between the device sheet 202 and the backside top electrode 206. The laminate 208 is then cut into two or more device modules A, B along the dashed lines that intersect the notches 205, 207. A pattern of conductive adhesive 210 (e.g., a conductive polymer or silver ink) is then disposed on a carrier substrate 211. The modules are adhered to the carrier substrate 211. A larger area 212 of the conductive adhesive 210 makes electrical contact with the contacts 203 of module A. Fingers 214 of conductive adhesive 210 project out from the larger area 212. The fingers 214 align with the notches 205, 207 of module B. Extra conductive adhesive may be placed on the fingers 214 to facilitate electrical contact with the bottom electrode of module B through the notches 205, 207. Preferably, the fingers 214 are narrower than the notches 207 in the backside top electrode 206 so that the conductive adhesive 210 does not make undesired electrical contact with the backside top electrode 206 of module B.

Figure 3:
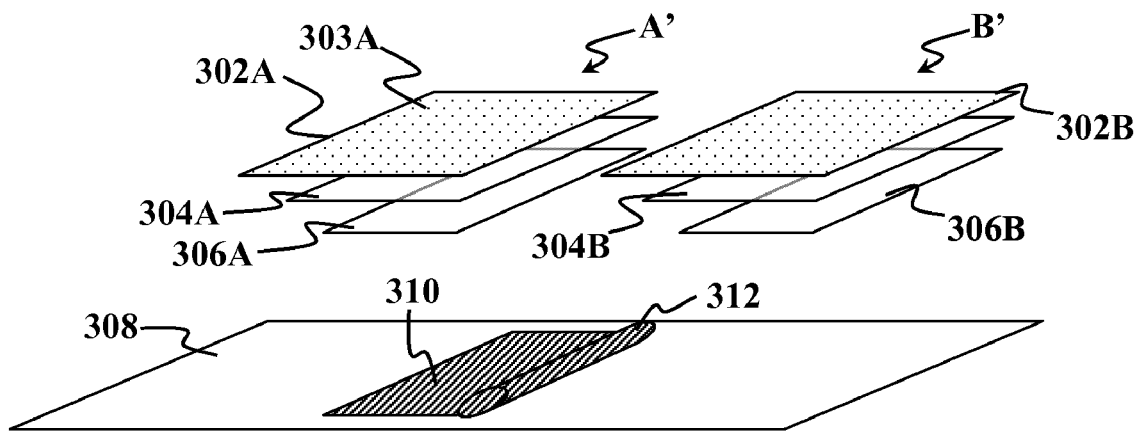
FIG. 3 is an exploded view schematic diagram illustrating fabrication of an array of optoelectronic devices according to an alternative embodiment of the present invention.

In the embodiment depicted in FIG. 2, the device sheet, insulating layer and backside top electrode were laminated together before being cut into individual modules. In alternative embodiments, the layers may be cut first and then assembled into modules (e.g., by lamination). For example, as shown in FIG. 3, first and second device modules A', B' may be respectively laminated from pre-cut device layers 302A, 302B, insulating layers 304A, 304B, and backside top electrodes 306A, 306B. Each device layer 302A, 302B includes an active layer between a transparent conducting layer and a bottom electrode. At least one device layer 302A includes electrical contacts 303A (and optional conductive traces) of the type described above.

In this example, the backside top electrode layer 306B of module B has been cut back by simply making it shorter than the insulating layer 304B so that the insulating layer 304B overhangs an edge of the backside top electrode layer 306B. Similarly, the insulating layer 304B has been cut back by making it shorter than the device layer 302B or, more specifically, shorter than the bottom electrode of device layer 302B. After the pre-cut layers have been laminated together to form the modules A', B' the modules are attached to a carrier substrate 308 and electrical connection is made between the backside top electrode 306A of module A' and the bottom electrode of the device layer 302B of module B'. In the example shown in FIG. 3, the connection is made through a conductive adhesive 310 with a raised portion 312, which makes contact with the bottom electrode while avoiding undesired contact with the backside top electrode 306B of module B'.

Figure 4A:
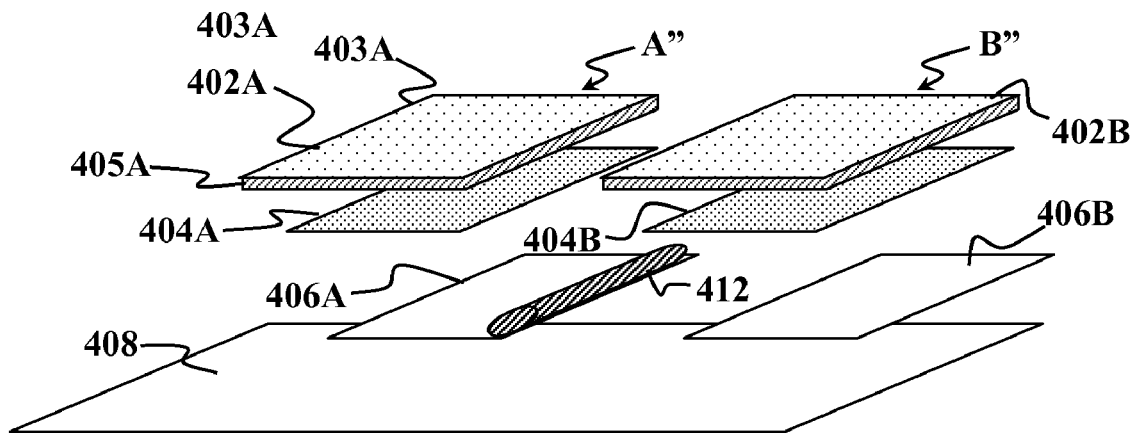
FIG. 4A is an exploded view schematic diagram illustrating fabrication of an array of optoelectronic devices according to another alternative embodiment of the present invention.
Figure 4B:
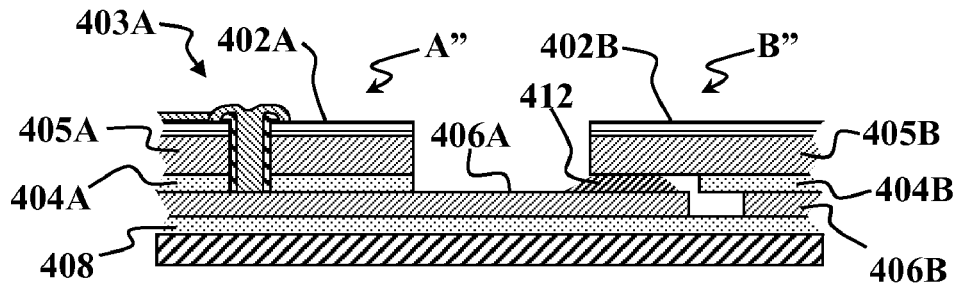
FIG. 4B is a cross-sectional schematic diagram illustrating a portion of the array of FIG. 4A.

FIGS. 4A-4B depict a variation on the method depicted in FIG. 3 that reduces the use of conductive adhesive. First and second device modules A", B" are assembled from pre-cut device layers 402A, 402B, insulating layers 404A, 404B and backside top electrode layers 406A, 406B and attached to a carrier substrate 408. Insulated electrical contacts 403A make electrical contact through the device layers 402A, a bottom electrode 405A and the insulating layer 406A as shown in FIG. 4B. Front edges of the insulating layer 404B and backside top electrode 406B of module B" are cut back with respect to the device layer 402B as described above with respect to FIG. 3. To facilitate electrical contact, however, a back edge of the backside top electrode 406A of module A" extends beyond the back edges of the device layer 402A and insulating layer 404A. As a result, the device layer 402B of module B" overlaps the backside top electrode 406A of module A". A ridge of conductive adhesive 410 on an exposed portion 407A of the backside top electrode 406A makes electrical contact with an exposed portion of a bottom electrode 405B of the device layer 402B as shown in FIG. 4B.

Figure 5A:
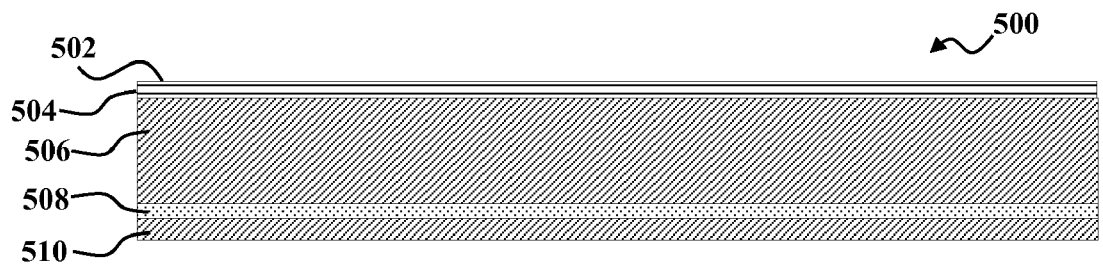
FIGS. 5A-5I are cross-sectional schematic diagrams illustrating formation of electrical contacts according to embodiments of the present invention.

In the discussion of the electrical contacts 120 between the transparent conductive layer and the backside top electrode, vias were formed, coated with an insulating material and filled with a conductive material. In an alternative embodiment, connection between the transparent conductive layer and the backside top electrode may be effected using a portion of the bottom electrode as part of the electrical contact. FIGS. 5A-5H illustrate examples of how this may be implemented. Specifically, one may start with a structure 500 (as shown in FIG. 5A) with a transparent conducting layer 502 (e.g., Al:ZnO, i:ZnO), an active layer 504 (e.g., CIGS), a bottom electrode 506 (e.g., 100 um Al), an insulating layer 508 (e.g., 50 um PET), and a backside top electrode 510 (e.g., 25 um Al). Preferably, the backside top electrode 510 is in the form of a thin aluminum tape that is laminated to the bottom electrode 506 using an insulating adhesive as the insulating layer 508. This can greatly simplify manufacture and reduce materials costs.

Figure 5B:
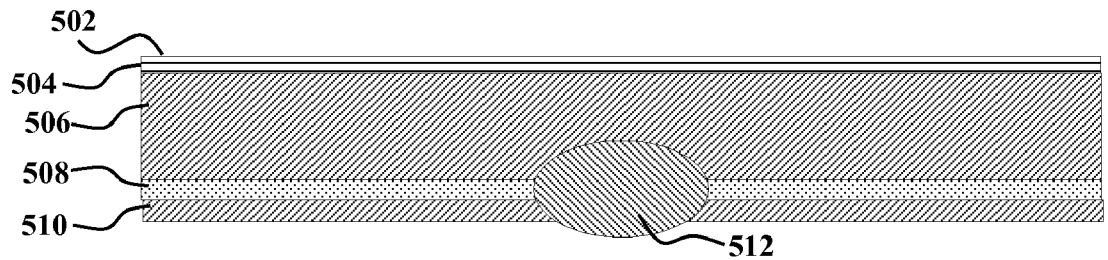

Electrical connection 512 may be made between the bottom electrode 506 and the backside top electrode at one or more locations as shown in FIG. 5B. For example, a spot weld may be formed through insulating layer 508, e.g., using laser welding. Such a process is attractive if it can make the electrical connection in a single step. Alternatively, the electrical connection 512 may be formed through a process of drilling a blind hole through the backside top electrode 510 and the insulating layer 508 to the bottom electrode and filling the blind hole with an electrically conductive material such as a solder or conductive adhesive.

Figure 5C:
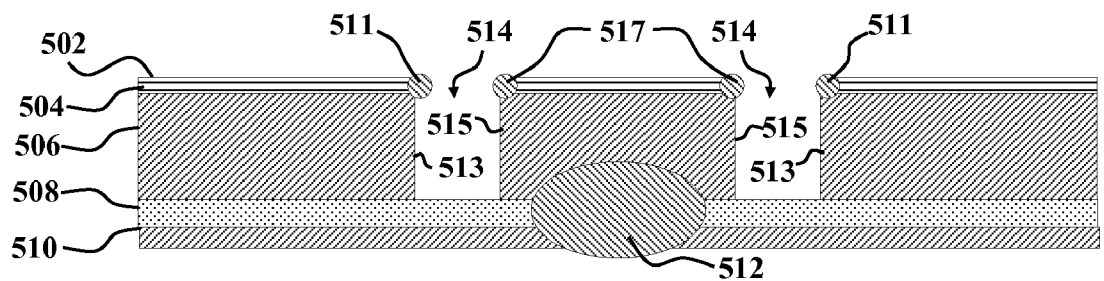

As shown in FIG. 5C, a trench 514 is then formed in a closed loop (e.g., a circle) around the electrical connection 512. The closed-loop trench 514 cuts through the transparent conducting layer 502, active layer 504, bottom electrode 506, and insulating layer 508 to the backside top electrode 510. The trench 514 isolates a portion of the bottom electrode 506, active layer 504, and transparent conductive layer 502 from the rest of the structure 500. Techniques such as laser machining may be used to form the trench 514. If laser welding forms the electrical connection 512 with one laser beam and a second laser beam forms the trench 514, the two laser beams may be pre-aligned with respect to each other from opposite sides of the structure 500. With the two lasers pre-aligned, the electrical connection 512 and trench 514 may be formed in a single step, thereby enhancing the overall processing speed.

Figure 5D:
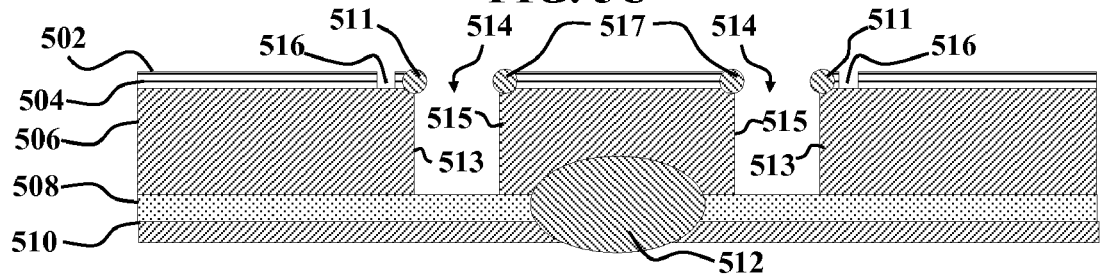

The process of forming the isolation trench may case electrical short-circuits 511, 517 between the transparent conductive layer 502 and the bottom electrode 506. To electrically isolate undesirable short circuits 511 formed on an outside wall 513 of the trench 514 an isolation trench 516 is formed through the transparent conductive layer and the active layer to the bottom electrode 506 as shown in FIG. 5D. The isolation trench 516 surrounds the closed-loop trench 514 and electrically isolates the short circuits 511 on the outside wall 513 of the trench from the rest of the structure 500. A laser scribing process may form the isolation trench 516. A lesser thickness of material being scribed reduces the likelihood of undesired short circuits resulting from formation of the isolation trench 516.

Figure 5E:
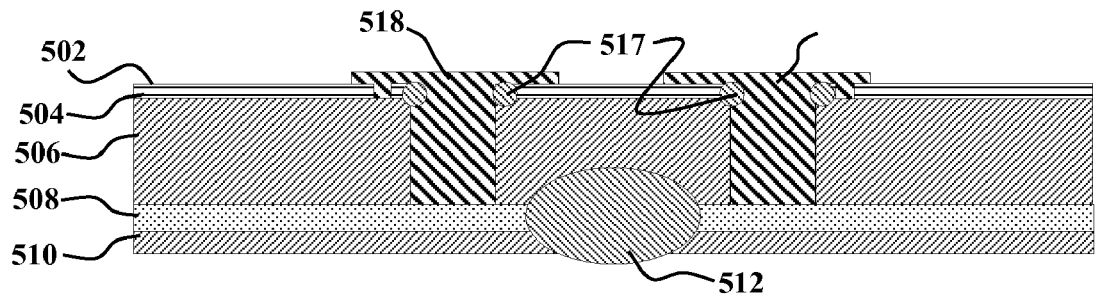
Figure 5F:
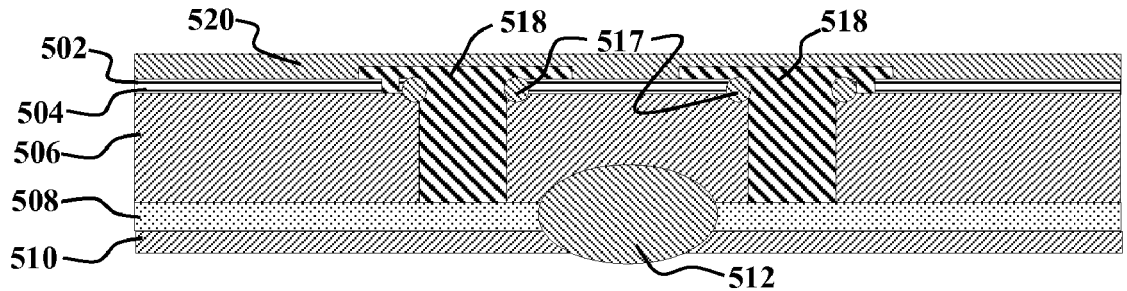

Not all short circuits between the transparent conducting layer 502 and the bottom electrode 506 are undesirable. Electrical shorts 517 along an inside wall 515 of the trench 514 can provide part of a desired electrical path to the electrical connection 512. If a sufficient amount of desirable short circuiting is present, the electrical contact may be completed as depicted in FIG. 5E-5F. First an insulating material 518 is deposited into the closed-loop trench 514 and isolation trench 516 e.g., in a "donut" pattern with a hole in the middle as shown in FIG. 5E. Next electrically conductive fingers 520 are deposited over portions of the structure 500 including the isolated portion surrounded by the trench 514 and non-isolated portions as depicted in FIG. 5F. The insulating material 518 may be deposited in a way that provides a sufficiently planar surface suitable for forming the conductive fingers 520. Electrical contact is then made between the transparent conducting layer 502 in the non-isolated portions outside the trench 514 and the backside top electrode 510 through the fingers 520, the transparent conducting layer within the isolated portion, electrical shorts 517 on the inside wall of the trench 514, the portion of the bottom electrode 506 inside the trench 514 and the electrical connection 512.

Figure 5G:
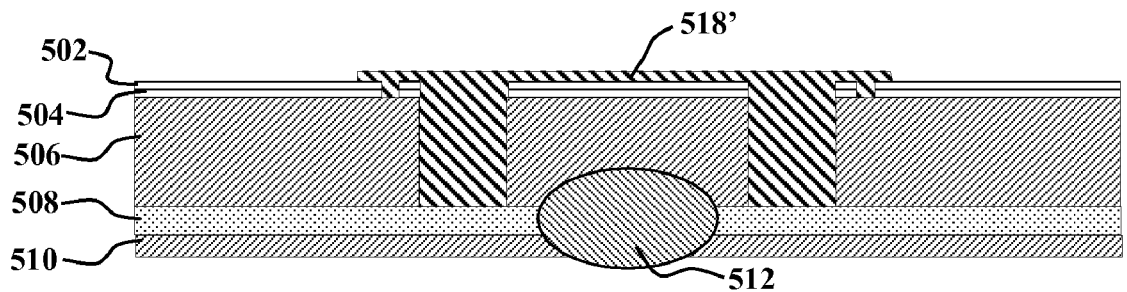
Figure 5H:
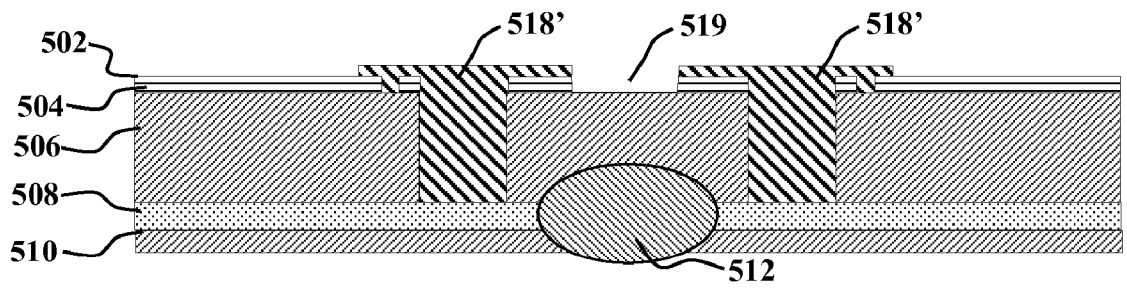
Figure 5I:
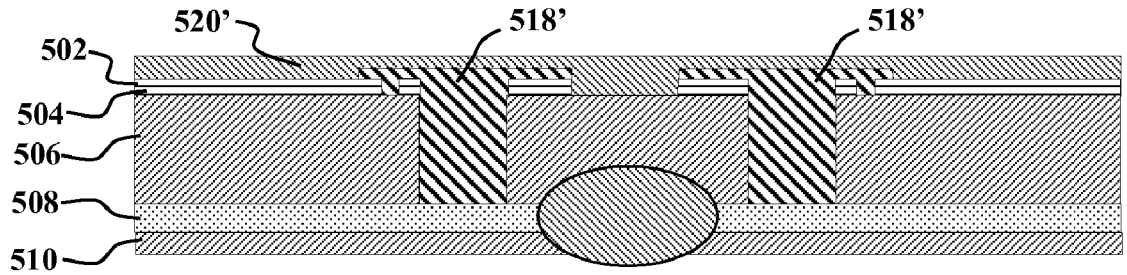

Alternatively, if the shorts 517 do not provide sufficient electrical contact, a process of drilling and filling may provide electrical contact between the fingers 520 and the isolated portion of the bottom electrode 506. In an alternative embodiment depicted in FIGS. 5G-5I, it is possible that insulating material 518' covers the isolated portion when it is deposited as shown in FIG. 5G. The insulating material 518' covering the isolated portion may be removed, e.g., by laser machining or mechanical processes such as drilling or punching, along with corresponding portions of the transparent conductive layer 502 and the active layer 504 to expose the bottom electrode 506 through an opening 519 as shown in FIG. 5H. Electrically conductive material 520' forms conductive fingers, as described above. The electrically conductive material makes contact with the exposed bottom electrode 506 through the opening 519 and completes the desired electrical contact as shown in FIG. 5I.

Note that there are several variations on the techniques described above with respect to FIGS. 5A-5I. For example, in some embodiments it may be desirable to make the electrical connection 512 after the closed-loop trench has been formed and filled with insulating material. There are several advantages of the above-described process for forming the electrical contact. The process steps are simplified. It is easier to deposit the insulating layer without worrying about covering up the backside top electrode. The process allows for a planar surface for depositing the fingers 520, 520'. Reliable electrical contact can be made between the bottom electrode 506 and the backside top electrode 510 through laser welding. Furthermore, electrical shorts can be isolated without jeopardizing a 100% yield.

Embodiments of the present invention facilitate relatively low cost manufacture of large-scale arrays of series-connected optoelectronic devices. Larger devices may be connected in series due to the reduced sheet resistance as a result of the connection between backside top electrodes and the transparent conducting layers through the contacts that penetrate the layers of the device modules. The conductive traces can further reduce sheet resistance. Larger devices can be arrayed with fewer connections.

Although for the purpose of illustration, the examples described herein show only two optoelectronic device modules connected in series, it will be appreciated that three or more such device modules may be so connected in accordance with embodiments of the present invention.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for fabricating an array of series interconnected optoelectronic device modules, wherein each device module includes an active layer disposed between a bottom electrode and a transparent conducting layer, the steps comprising:
    disposing an insulating layer between the bottom electrode of a first device module and a backside top electrode of the first device module,
    forming one or more electrical contacts through the transparent conducting layer, active layer, bottom, electrode and insulating layer of the first device module that make electrical contact between the transparent conducting layer and the backside top electrode;
    providing a second device module wherein a portion of the bottom electrode of the second device module is exposed; and
    using a laser weld to make electrical contact between the backside top electrode of the first device module and the exposed portion of the bottom electrode of the second device module.

2. The method of claim 1 wherein making electrical contact between the backside top electrode of the first device module and the exposed portion of the bottom electrode of the second device module includes disposing a layer of conductive adhesive over a portion of an insulating carrier substrate;
    attaching the first device module to the carrier substrate such that the backside top electrode makes electrical contact with the conductive adhesive while leaving an exposed portion of the conductive adhesive; and
    making electrical contact between the exposed portion of the conductive adhesive and the exposed portion of the bottom electrode of the second device module.

3. The method of claim 2 wherein making electrical contact between the exposed portion of the conductive adhesive and the exposed portion of the bottom electrode includes placing a bump of conductive adhesive on the layer of conductive adhesive at a location aligned with the exposed portion of the bottom electrode of the second device module, wherein the bump is sufficiently tall as to make contact with the exposed portion of the bottom electrode when the second device module is attached to the carrier substrate.

4. The method of claim 1 wherein the second device module includes an insulating layer shorter than the rest of the second device module such that part of the bottom electrode projects beyond an edge of the insulating layer.

5. The method of claim 4 wherein exposing a portion of the backside top electrode includes making the backside top electrode shorter than the insulating layer such that part of the insulating layer projects beyond an edge of the backside top electrode.

6. The method of claim 1 wherein the first and second optoelectronic device modules are photovoltaic device modules.

7. The method of claim 1 further comprising electrically isolating the one or more electrical contacts from the active layer, the bottom electrode and the insulating layer.

8. The method of claim 1 wherein disposing an insulating layer between the bottom electrode and a backside top electrode of the first device module includes laminating the insulating layer to the backside top electrode to form a laminate and attaching the laminate to the first device module with the insulating layer between the bottom electrode and the backside top electrode.

9. The method of claim 8 wherein laminating the insulating layer to the backside top electrode to form a laminate includes cutting the insulating material and backside top electrode to desired lengths before laminating the insulating to the backside top electrode.

10. The method of claim 1 wherein forming the one or more electrical contacts includes avoiding shorting connections between the backside top electrode and the bottom electrode.

11. The method of claim 10 wherein avoiding shorting connections includes supplementing mechanical cutting techniques with laser ablative removal of a small volume of material near a lip of a via.

12. The method of claim 10 wherein avoiding shorting connections includes depositing a thin layer of insulating material on top of the active layer proximate an area where a via is to be formed prior to forming the transparent conducting layer.

13. The method of claim 12 wherein the thin insulating layer is in the range of about 1 micron to about 100 microns thick.

14. The method of claim 1 wherein forming the one or more electrical contacts includes forming one or more vias through the active layer, transparent conducting layer and insulating layer of the first device module;
    coating sidewalls of the vias with an insulating material such that a channel is formed through the insulating material to the backside top electrode of the first device module;
    at least partially filling the channel with an electrically conductive material to form a plug that makes electrical contact between the transparent conducting layer and the backside top electrode of the first device module.

* * * * *